United States Patent
Chen et al.

(10) Patent No.: US 9,735,540 B2
(45) Date of Patent: Aug. 15, 2017

(54) LASER

(71) Applicant: HUAWEI TECHNOLOGIES CO., LTD., Shenzhen (CN)

(72) Inventors: Xi Chen, Shenzhen (CN); Bo Chen, Shenzhen (CN); Li Zeng, Shenzhen (CN); Lei Gao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/177,853

(22) Filed: Jun. 9, 2016

(65) Prior Publication Data

US 2016/0294158 A1 Oct. 6, 2016

Related U.S. Application Data (63) Continuation of application No. PCT/CN2013/089244, filed on Dec. 12, 2013.

(51) Int. Cl.
*H01S 5/10* (2006.01)
*H01S 5/028* (2006.01)
(Continued)

(52) U.S. Cl.
CPC ............ *H01S 5/1007* (2013.01); *H01S 5/028* (2013.01); *H01S 5/142* (2013.01); *H01S 5/3013* (2013.01);
(Continued)

(58) Field of Classification Search
CPC ........ H01S 5/1007; H01S 5/028; H01S 5/142; H01S 5/0265; H01S 5/0287; H01S 5/06256
See application file for complete search history.

(56) References Cited

U.S. PATENT DOCUMENTS

| 5,913,000 A | 6/1999 | Doerr et al. |
| 7,058,096 B2 | 6/2006 | Sarlet et al. |

(Continued)

FOREIGN PATENT DOCUMENTS

| CN | 102906949 A | 1/2013 |
| CN | 103098488 A | 5/2013 |

(Continued)

OTHER PUBLICATIONS

Laroy et al., "Stabilisation and control of widely tunable MG-Y lasers with intergrated photodetectors", IET Optoelectron, vol. 1, No. 1, 2007, pp. 35-38.*

(Continued)

*Primary Examiner* — Armando Rodriguez
(74) *Attorney, Agent, or Firm* — Staas & Halsey LLP (57) ABSTRACT

A laser includes a substrate and a resonant cavity. In addition to an active gain region, a first phase shift region, an optical branching region, and N reflective mode selection regions, the resonant cavity further includes a highly reflective surface, where a reflectivity of the highly reflective surface is greater than reflectivities of the N reflective mode selection regions, so that laser beams are output from the N reflective mode selection regions. Because the laser naturally includes at least two reflective mode selection regions, at least two laser beams are output. According to the laser provided by the embodiments of the present invention, one laser can output two laser beams or even multiple laser beams; therefore, laser beam generation efficiency is high and average costs for generating a single laser beam are accordingly reduced.

11 Claims, 5 Drawing Sheets

(51) Int. Cl.
*H01S 5/30* (2006.01)
*H01S 5/14* (2006.01)
*H01S 5/0625* (2006.01)
*H01S 5/02* (2006.01)
*H01S 5/026* (2006.01)

(52) U.S. Cl.
CPC .............. *H01S 5/021* (2013.01); *H01S 5/0265* (2013.01); *H01S 5/0287* (2013.01); *H01S 5/06256* (2013.01)

(56) References Cited

U.S. PATENT DOCUMENTS

| 8,295,315 | B2 | 10/2012 | Ward et al. |
| 2003/0152116 | A1 | 8/2003 | Liao et al. |
| 2011/0085572 | A1 | 4/2011 | Dallesasse et al. |
| 2013/0016423 | A1 | 1/2013 | Zheng et al. |
| 2014/0133511 | A1 | 5/2014 | Tanaka |

FOREIGN PATENT DOCUMENTS

| JP | 11-307847 | | 11/1999 |
| WO | 2007/107187 | A1 | 9/2007 |
| WO | WO 2007/107187 | * | 9/2007 |
| WO | 2013/021421 | A1 | 2/2013 |
| WO | 2014/107537 | A1 | 7/2014 |

OTHER PUBLICATIONS

International Search Report and written opinion dated Sep. 16, 2014 in corresponding International Patent Application No. PCT/CN2013/089244.

Extended European Search Report dated Nov. 9, 2016 in corresponding European Patent Application No. 13899254.0.

International Search Report mailed Sep. 16, 2014, in corresponding International Application No. PCT/CN2013/089244.

* cited by examiner

LASER

CROSS-REFERENCE TO RELATED APPLICATIONS

This application is a continuation of International Application No. PCT/CN2013/089244, filed on Dec. 12, 2013, which is hereby incorporated by reference in its entirety.

TECHNICAL FIELD

Embodiments of the present invention relate to the field of communications technologies, and specifically, to a laser.

BACKGROUND

In last two decades, optical communications technologies have achieved rapid development. In an optical communications system, information is modulated into light to form an optical signal, the optical signal is transmitted to a destination by using an optical fiber, and the information carried in the optical signal is demodulated after arrival at the destination. Optical communications has advantages of a high speed and low crosstalk, and therefore is a development direction of a fixed network in future.

Before a signal is modulated, a laser needs to generate light. The laser is a device that employs a stimulated emission theory to enable light in some stimulated substance to be amplified or emitted in an oscillating manner. According to an existing commercial tunable laser, laser power is output from one port. When multiple laser beams with a same frequency are required, an additional beam splitting structure is required at an output end, or multiple same lasers are required. It can be seen that an existing laser features low laser beam generation efficiency and relatively high costs.

SUMMARY

In view of this, embodiments of the present invention provide a laser.

The laser provided by the embodiments of the present invention includes a substrate and a resonant cavity; the resonant cavity includes a highly reflective surface, an active gain region, a first phase shift region, an optical branching region, and N reflective mode selection regions, where the resonant cavity is configured to generate a laser beam, and N is greater than or equal to 2; the active gain region, the first phase shift region, the optical branching region, and the N reflective mode selection regions are coupled to the substrate; the active gain region includes two ports, and the two ports of the active gain region are optically coupled with the highly reflective surface and the first phase shift region respectively; the first phase shift region includes two ports, and the two ports of the first phase shift region are optically coupled with the active gain region and the optical branching region respectively; the optical branching region includes N+1 ports, one port of the optical branching region is optically coupled with the first phase shift region, and the other N ports of the optical branching region are optically coupled with the N reflective mode selection regions respectively; each reflective mode selection region of the N reflective mode selection regions includes two ports, one port is optically coupled with the optical branching region, and the other port is configured to output the laser beam; and a reflectivity of the highly reflective surface is greater than reflectivities of the N reflective mode selection regions.

The active gain region includes a III-V compound and is configured to generate spontaneous emission light under the effect of forward bias; the first phase shift region is configured to tune a spectral position of a longitudinal mode of the resonant cavity by changing a refractive index of the first phase shift region; the optical branching region is configured to perform power splitting on light from the first phase shift region and output N beams of light obtained after power splitting to the N reflective mode selection regions, and is further configured to combine light from the N reflective mode selection regions and output light obtained after light combination to the first phase shift region; and each of the N reflective mode selection regions include a transflective structure, a reflection peak emerges periodically on a spectral reflectance curve of each reflective mode selection region as a light wavelength changes continually, and the spectral reflectance curves of the N reflective mode selection regions have reflection peaks on a same wavelength position, where the spectral reflectance curve is a spectral line that uses the light wavelength or a light frequency as a horizontal axis and a reflectivity as a vertical axis and that reflects variation of the reflectivity with the light wavelength.

Optionally, the laser may further include at least one second phase shift region; the at least one second phase shift region is coupled to the substrate; at least one reflective mode selection region of the N reflective mode selection regions is optically coupled with the optical branching region by using the at least one second phase shift region; and the at least one second phase shift region is configured to adjust a phase of light passing through the at least one second phase shift region.

The laser provided by the embodiments of the present invention includes a substrate and a resonant cavity. In addition to an active gain region, a first phase shift region, an optical branching region, and N reflective mode selection regions, the resonant cavity further includes a highly reflective surface, where a reflectivity of the highly reflective surface is greater than reflectivities of the N reflective mode selection regions, so that laser beams are output from the N reflective mode selection regions. Because the laser naturally includes at least two reflective mode selection regions, at least two laser beams are output. According to the laser provided by the embodiments of the present invention, one laser can output two laser beams or even multiple laser beams; therefore, laser beam generation efficiency is high and average costs for generating a single laser beam are accordingly reduced.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

It should be noted that, in the embodiments of the present invention, "coupling" and "connection" mainly refer to a direct or indirect physical connection, and "optical coupling" mainly refers to a direct or indirect connection relationship in an optical path. Surely, "coupling" and "optical coupling" may coexist in many cases, and therefore the two are not mutually exclusive.

An embodiment of the present invention provides a laser, where the laser includes a substrate and a resonant cavity; the resonant cavity includes a highly reflective surface, an active gain region, a first phase shift region, an optical branching region, and N reflective mode selection regions, where the resonant cavity is configured to generate a laser beam, and N is greater than or equal to 2; the active gain region, the first phase shift region, the optical branching region, and the N reflective mode selection regions are coupled to the substrate; the active gain region includes two ports, and the two ports of the active gain region are optically coupled with the highly reflective surface and the first phase shift region respectively; the first phase shift region includes two ports, and the two ports of the first phase shift region are optically coupled with the active gain region and the optical branching region respectively; the optical branching region includes N+1 ports, one port of the optical branching region is optically coupled with the first phase shift region, and the other N ports of the optical branching region are optically coupled with the N reflective mode selection regions respectively; each reflective mode selection region of the N reflective mode selection regions includes two ports, one port is optically coupled with the optical branching region, and the other port is configured to output the laser beam; and a reflectivity of the highly reflective surface is greater than reflectivities of the N reflective mode selection regions.

The active gain region includes a III-V compound and is configured to generate spontaneous emission light under the effect of forward bias; the first phase shift region is configured to tune a spectral position of a longitudinal mode of the resonant cavity by changing a refractive index of the first phase shift region; the optical branching region is configured to perform power splitting on light from the first phase shift region and output N beams of light obtained after power splitting to the N reflective mode selection regions, and is further configured to combine light from the N reflective mode selection regions and output light obtained after light combination to the first phase shift region; and each of the N reflective mode selection regions include a transflective structure, a reflection peak emerges periodically on a spectral reflectance curve of each reflective mode selection region as a light wavelength or frequency changes continually, and the spectral reflectance curves of the N reflective mode selection regions have reflection peaks at a same wavelength position, where the spectral reflectance curve is a spectral line that uses the light wavelength as a horizontal axis and a reflectivity as a vertical axis and that reflects variation of the reflectivity with the light wavelength.

Optionally, reflectivities of spectral reflectance curves of at least two reflective mode selection regions of the N reflective mode selection regions are mutually different at the wavelength or frequency position.

Optionally, the laser further includes N antireflective surfaces, and the N antireflective surfaces are optically coupled respectively with the ports that are of the N reflective mode selection regions and that are configured to output the laser beam.

Optionally, the laser further includes N optical power tuning regions and N antireflective surfaces, where each optical power tuning region has two ports, one port is optically coupled with the port that is of one reflective mode selection region and that is configured to output the laser beam, the other port is optically coupled with one antireflective surface, and the optical power tuning region is configured to tune power of the laser beam emitted from the reflective mode selection region.

Optionally, the laser further includes N optical power tuning regions, N bent waveguide structures, and N antireflective surfaces, where each optical power tuning region and each bent waveguide structure have two ports, one port of each optical power tuning region is optically coupled with the port that is of one reflective mode selection region and that is configured to output the laser beam, the other port of each optical power tuning region is optically coupled with one bent waveguide structure, one port of each bent waveguide structure is optically coupled with one optical power tuning region, and the other port of each bent waveguide structure is optically coupled with one antireflective surface; and the optical power tuning region is configured to tune power of the laser beam emitted from the reflective mode selection region.

Optionally, the laser further includes at least one second phase shift region; the at least one second phase shift region is coupled to the substrate; at least one reflective mode selection region of the N reflective mode selection regions is optically coupled with the optical branching region by using the at least one second phase shift region; and the at least one second phase shift region is configured to adjust a phase of light passing through the at least one second phase shift region.

Optionally, the laser further includes a spot adjustment region; the first phase shift region is optically coupled with the optical branching region by using the spot adjustment region; and the spot adjustment region is configured to adjust a spot in light passing through the spot adjustment region. Further, the substrate includes a first substrate and a second substrate that are separated, and an empty slot is disposed between the first substrate and the second substrate; the active gain region and the first phase shift region are coupled on the first substrate, and the optical branching region and the N reflective mode selection regions are coupled on the second substrate; and the spot adjustment region is specifically a lens and disposed in the empty slot.

Optionally, the reflectivity of the highly reflective surface is greater than 50%.

Optionally, the reflective mode selection region is a superstructured sampled grating distributed Bragg reflector, or a microring structure, or a sampled fiber Bragg grating structure.

Optionally, if N is equal to 2, the optical branching region is a Y-type waveguide or a 1×2 multimode interferometer; and if N is greater than 2, the optical branching region is a 1×N multimode interferometer.

This embodiment of the present invention provides a laser that uses a "highly reflective surface+active gain region+first phase shift region+optical branching region+N reflective mode selection regions" structure and can emit narrow linewidth and wavelength-tunable laser beams. Meanwhile, the laser can output the laser beams from multiple emission ports with no need of additionally adding a beam splitting structure. In addition, reflectivities of reflective mode selection regions are set to different values, and accordingly, emission ports of the reflective mode selection regions may output laser beams of different power. Further, an antireflective surface and a bent waveguide may be added at a laser-beam output end, so as to suppress end face reflection at the laser-beam emission port. Further, a power tuning region may be further added to independently implement functions of flexibly tuning and turning off laser power at each laser-beam emission port.

The following details implementation of the embodiment of the present invention with reference to the accompanying drawings.

Figure 1:
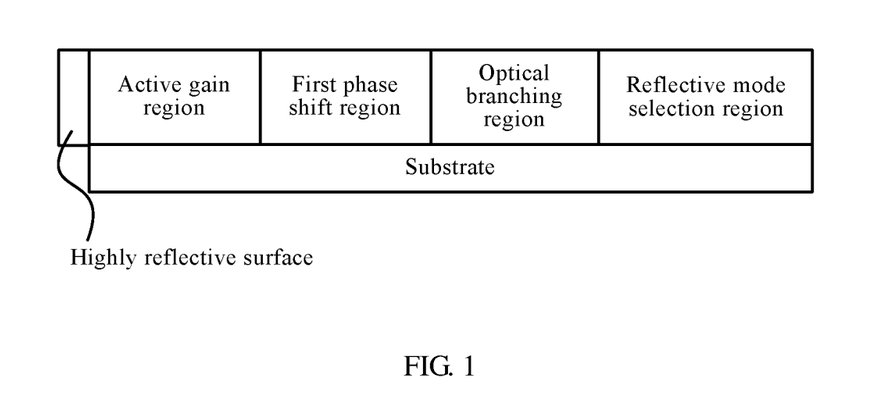
FIG. 1 is a side view of a laser according to an embodiment of the present invention.

Referring to FIG. 1, FIG. 1 is a side view of a laser according to an embodiment of the present invention. FIG. 1 is merely a schematic diagram, and is used to explain implementation details of the embodiment of the present invention and may slightly differ from a real object. An active gain region, a first phase shift region, an optical branching region, and a reflective mode selection region in the figure are optically coupled directly or indirectly. These regions may be connected directly, or may have spacing among them, or may also be optically coupled by using a waveguide or another optical connecting device, and even they may be directly coupled with another optical device, which is not limited in the embodiment of the present invention.

Figure 2:
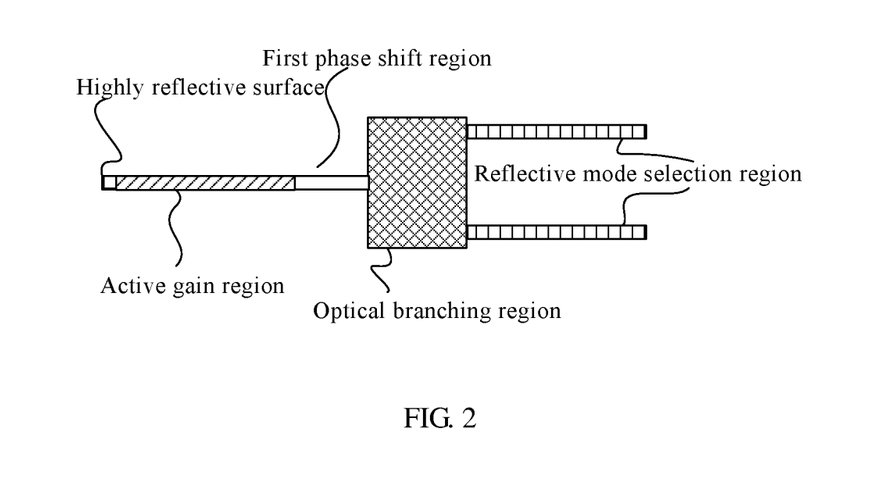
FIG. 2 is a top view (in which a substrate is omitted) of a laser according to an embodiment of the present invention.

Referring to FIG. 2, FIG. 2 is a top view of the laser in FIG. 1. A substrate is not shown in FIG. 2.

The active gain region includes two ports, one port is optically coupled with a highly reflective surface, and the other port is optically coupled with the first phase shift region. The active gain region is a region that includes a III-V semiconductor structure and that is used to generate spontaneous emission light. A III-V semiconductor mainly refers to a compound of a group III element and a group V element in the periodic table of elements, is also referred to as a compound semiconductor or a III-V compound, and mainly includes gallium arsenide (GaAs), indium phosphide (InP), gallium nitride, and the like. The active gain region includes positive and negative electrodes, configured to implement forward bias. The III-V semiconductor generates wide-spectrum spontaneous emission light under the effect of forward bias.

The first phase shift region may tune a spectral position of a longitudinal mode of a resonant cavity of the laser by changing a refractive index of the first phase shift region. The longitudinal mode of the resonant cavity of the laser is related to a cavity length of the resonant cavity and a refractive index of a transmission medium. The spectral position of the longitudinal mode of the resonant cavity may be tuned by changing the refractive index of the transmission medium, so as to finally obtain a required laser frequency. The refractive index of the first phase shift region may be changed in many manners: according to a specific material of the first phase shift region, a thermo-optic tuning method may be used, that is, a change of the refractive index of the first phase shift region is adjusted by using a temperature change; electrical injection tuning may be used, that is, the refractive index of the first phase shift region is changed by means of forming an injected carrier by using an applied electric field; and piezoelectric tuning may also be used.

The optical branching region is configured to combine and split light, and specifically may be a Y-type waveguide or a 1×N multimode interferometer.

The reflective mode selection region includes a transflective structure, where a reflectivity is less than a reflectivity of the highly reflective surface. It should be noted that a reflection peak emerges periodically on a spectral reflectance curve of each reflective mode selection region of reflective mode selection regions as a light wavelength or frequency changes continually.

The reflectivity of the highly reflective surface is greater than the reflectivity of the reflective mode selection region, where "greater than" herein refers to that the reflectivity of the highly reflective surface is greater than a peak value of the reflection peak of the reflective mode selection region. Because the reflectivity of the highly reflective surface is greater than the reflectivity of the reflective mode selection region, a laser beam with a majority of power is emitted from an emission port of the reflective mode selection region. If the reflectivity of the highly reflective surface is close to 100% or equal to 100%, a laser beam is emitted only from the reflective mode selection region. When the reflectivity of the highly reflective surface is relatively low, a part of a laser beam may also be emitted from the highly reflective surface, and this part of the laser beam may be used for monitoring, and the like.

Figure 3:
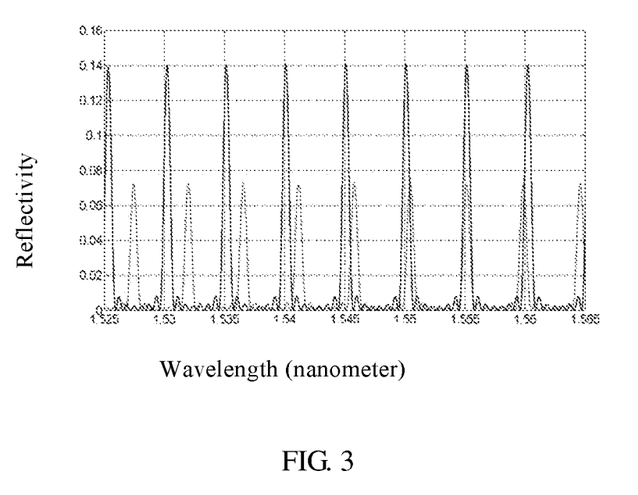
FIG. 3 is a view of spectral reflectance curves of two reflective mode selection regions of a laser according to an embodiment of the present invention.

Referring to FIG. 3, FIG. 3 is a view of spectral reflectance curves of the two reflective mode selection regions in FIG. 1 and FIG. 2. The spectral reflectance curves are represented by a solid line and a dotted line respectively in FIG. 3. It can be seen that the two reflective mode selection regions have different spectral reflectance curves. A cycle of a reflection peak of each spectral reflectance curve is different, and for different reflective mode selection regions, peak values of reflection peaks may be the same, or may be different. Reflection peaks of spectral reflectance curves of different reflective mode selection regions may coincide at a wavelength. Reflection peaks of the spectral reflectance curves of the two reflective mode selection regions in FIG. 3 coincide at a wavelength of 1555 nanometers. In this way, 1555-nanometer light generated by means of spontaneous emission is reflected, and the reflected light is amplified due to stimulated emission when passing through an active gain region. Therefore, the 1555-nanometer light is oscillated back and forth in a resonant cavity, and a stable 1555-nanometer laser beam is finally output.

Figure 4:
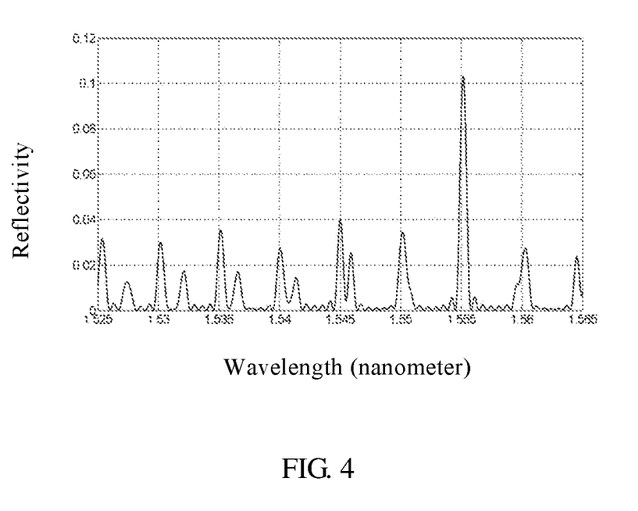
FIG. 4 is a view of a spectral reflectance curve of two reflective mode selection regions, as a whole, of a laser according to an embodiment of the present invention.

It can be seen from FIG. 3 that, free spectral ranges corresponding to the two reflective mode selection regions are 4.64 nanometers and 5 nanometers respectively. According to a Vernier effect, it can be obtained by calculation that a tunable wavelength range that can be achieved by the laser is 64.44 nanometers, and the wavelength range can cover a C-band wavelength range. Due to such a difference between the free spectral ranges of the two reflective mode selection regions, it may be implemented that reflection peaks coincide and overlap at only one wavelength position within the C-band range. As shown in FIG. 3, the reflection peaks coincide and overlap only at the 1555-nanometer wavelength. Reflected light generated by the reflective mode selection regions is returned to the optical branching region, and is emitted in a combined manner through a port connecting the optical branching region and the first phase shift region. A spectrum of the combined light is a result of interference and overlapping of beams of the reflected light. In a comprehensive view, multiple reflective mode selection regions as a whole have the spectral reflectance curve shown in FIG. 4. It can be seen that a reflection peak is highest at a 1555-nanometer wavelength, and peak values of reflection peaks of other levels are suppressed and decreased after light combination, so that light with the 1555-nanometer wavelength has a smallest threshold gain in a resonant cavity between a highly reflective surface and the reflective mode selection region, thereby implementing single longitudinal mode lasing.

A laser beam generated by the resonant cavity is emitted from two ports of the reflective mode selection regions respectively. Because reflectivities of the two reflective mode selection regions may be different, for example, a reflectivity of one reflective mode selection region may be twice a reflectivity of the other reflective mode selection region, optical power of a laser beam emitted from one reflective mode selection region is ½ of optical power of a laser beam emitted from the other reflective mode selection region. In this way, unbalanced output of emission power from two different emission ports may be implemented by setting reflectivities of different reflective mode selection regions. Optionally, gratings of different reflectivities may be formed by using different coupling factor or different sampling cycles. Optionally, when the reflective mode selection region is a microring structure, a reflectivity may be controlled by controlling spacing between a ring in the microring structure and a corresponding coupling waveguide, and the reflectivity may also be controlled by controlling a coupling factor for coupling a waveguide to a ring.

Meanwhile, an overlapping position of the reflective mode selection regions may be adjusted by means of heating tuning, or electrical injection tuning, or piezoelectric tuning, thereby implementing tuning of a wavelength.

In FIG. 1, FIG. 2, and FIG. 3, a quantity of the reflective mode selection regions is exemplarily 2, and actually may be 3, 4, or even more, which is not limited in this embodiment of the present invention. Meanwhile, reflectivities of the reflective mode selection regions may be set to be different. In this way, output laser power of the reflective mode selection regions may also be different. Therefore, one laser may output multiple laser beams of different power, so as to meet different application scenarios.

Figure 5:
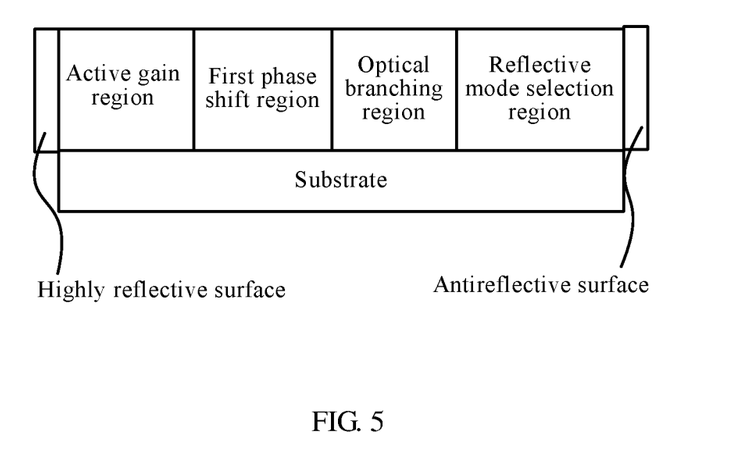
FIG. 5 is a side view of a laser according to an embodiment of the present invention.

As shown in FIG. 5, a laser provided by an embodiment of the present invention may further include an antireflective surface, which may be configured to suppress end face reflection. Further, the laser may further include a bent waveguide, configured to suppress end face reflection. Specifically, the antireflective surface may be an antireflective film, a grating with a low reflectivity and a high transmittance, a gradient waveguide structure, or the like.

Figure 6:
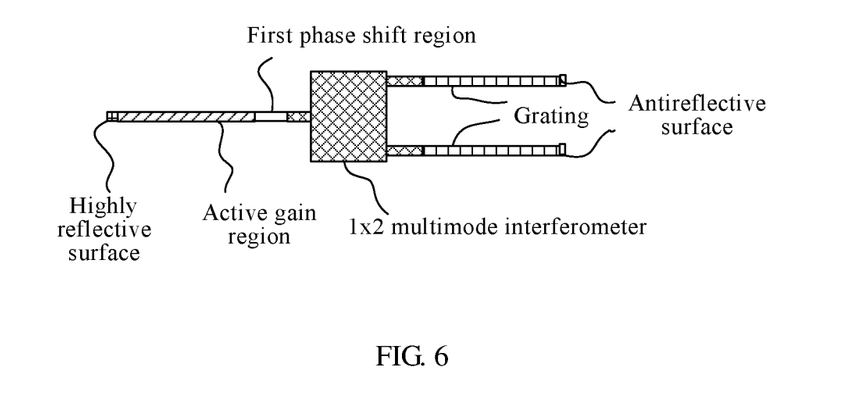
FIG. 6 is a top view (in which a substrate is omitted) of a laser according to an embodiment of the present invention.

Referring to FIG. 6, FIG. 6 shows a laser provided by an embodiment of the present invention. In this implementation manner, an optical branching region is specifically a 1×2 multimode interferometer MMI, and a reflective mode selection region is specifically a grating. The grating may be specifically a superstructured sampled grating distributed Bragg reflector (SSGDBR), and may also be another appropriate grating structure. A reflectivity of a highly reflective surface is greater than 50%, for example, may be 95%. A peak value of a reflectivity of the SSGDBR may be 7%, 14%, 20%, or the like, and reflectivities of two SSGDBRs may be the same, or may be different.

Figure 7A:
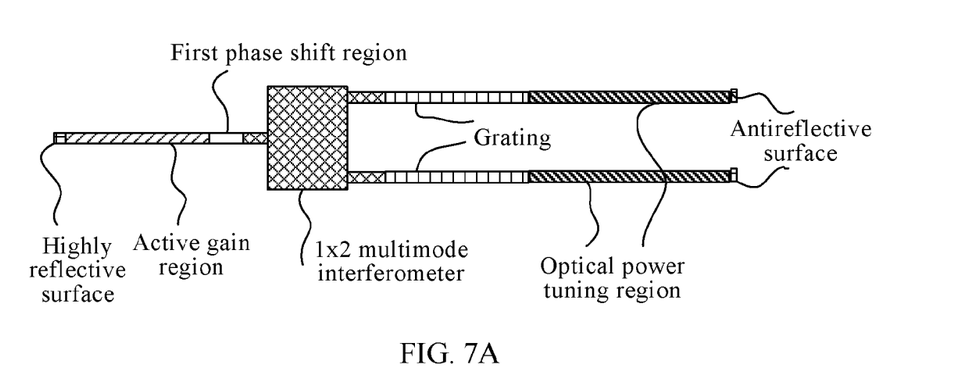
FIGS. 7A and 7B are top views (in which a substrate is omitted) of lasers according to embodiments of the present invention.
Figure 7B:
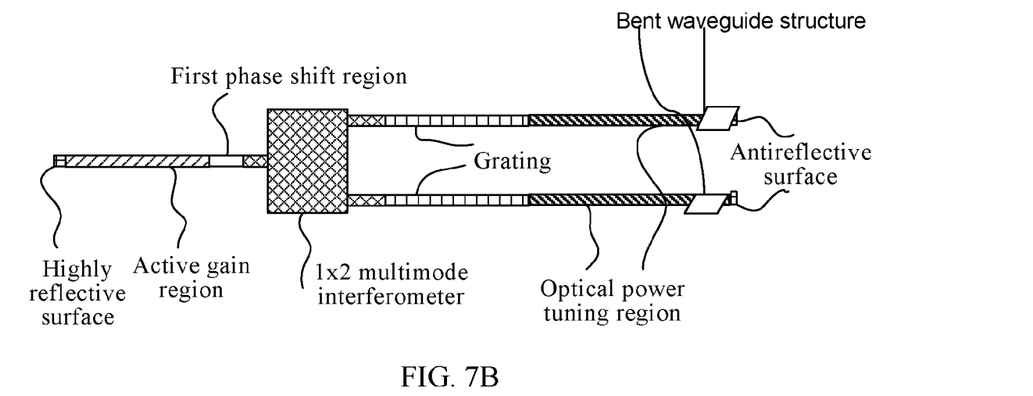

As shown in FIG. 7A, in still another implementation manner provided by an embodiment of the present invention, a laser further includes an optical power tuning region. The optical power tuning region may be configured to independently tune, amplify, or turn off emission power of a laser beam from a reflective mode selection region. Specifically, an injection current is formed by applying a forward or reverse bias voltage on optical power tuning, where a size of the injection current determines times of gain amplification of an optical gain region. If a forward bias voltage is applied, an emitted laser beam is amplified; and if a reverse bias voltage is applied, an emitted laser beam is decreased, and even is completely absorbed, thereby implementing power tuning of the emitted laser beam. As shown in FIG. 7B, in still another implementation manner provided by an embodiment of the present invention, a laser further includes bent waveguide structures.

Figure 8:
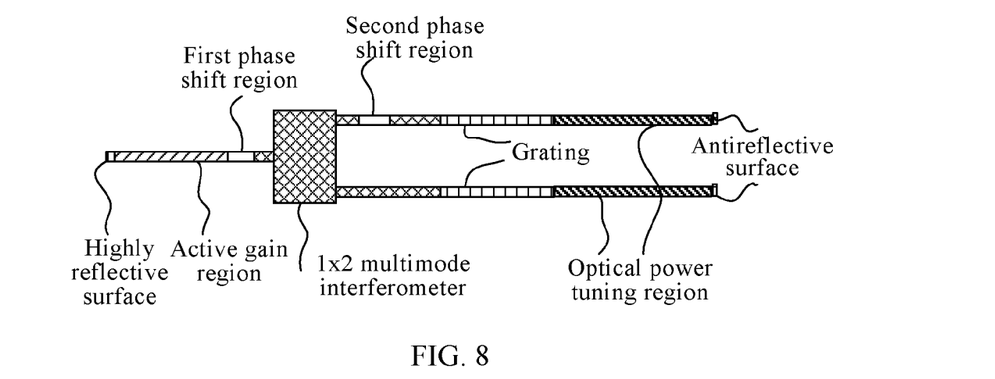
FIG. 8 is a top view (in which a substrate is omitted) of a laser according to an embodiment of the present invention.

As shown in FIG. 8, in still another implementation manner provided by an embodiment of the present invention, a laser further includes a second phase shift region, configured to adjust a phase of light passing through the second phase shift region, so that when the light returns from reflective mode selection regions to an optical branching region for light combination, phases of light returned from each reflective mode selection region are consistent, thereby generating a phase overlapping effect. Specifically, a refractive index of the second phase shift region may be adjusted by means of heating tuning, electrical injection tuning, or piezoelectric tuning, so as to achieve an effect of phase adjustment of light. Specifically, when other conditions remain unchanged, the refractive index of the second phase shift region may be adjusted gradually. When power of an emitted laser beam is largest, it may be deemed that the phases of light returned from each reflective mode selection region are consistent, and a phase overlapping effect is generated. FIG. 8 exemplarily shows an example that the reflective mode selection region is a grating, and a quantity of reflective mode selection regions is 2. Actually, when there are multiple reflective mode selection regions, there may be multiple second phase shift regions that are respectively configured to modulate phases of light from the reflective mode selection regions.

Figure 9:
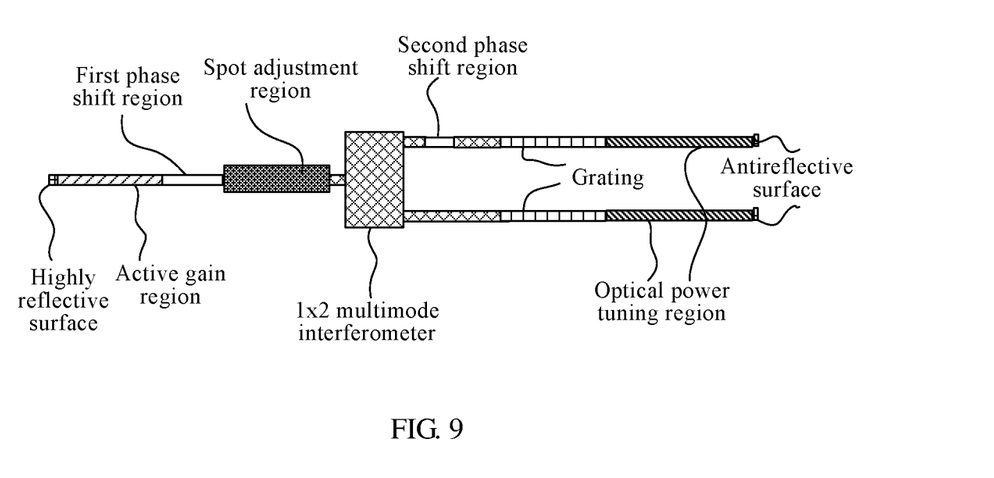
FIG. 9 is a top view (in which a substrate is omitted) of a laser according to an embodiment of the present invention.

As shown in FIG. 9, in still another implementation manner provided by an embodiment of the present invention, a laser further includes a spot adjustment region, configured to adjust a spot size and shape. Specifically, the spot adjustment region may be configured to adjust a spot in a resonant cavity, so that light from a first phase shift region may be better coupled to an optical branching region. The spot adjustment region may be specifically a waveguide, a lens, or another optical device for adjusting a spot.

Figure 10:
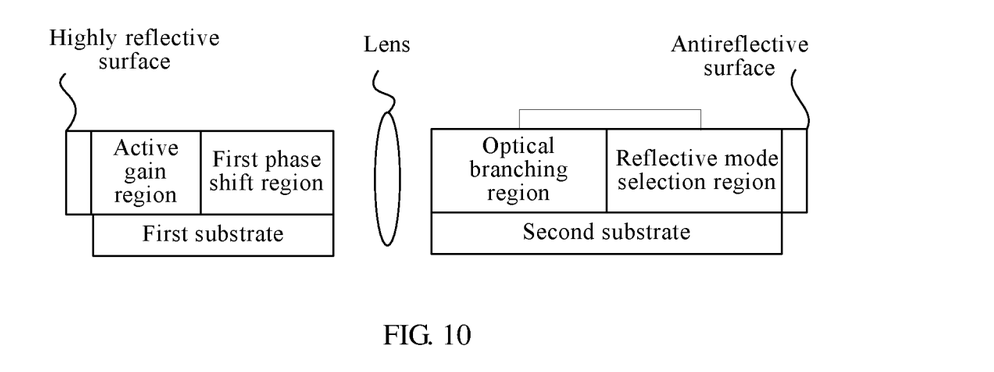
FIG. 10 is a side view of a laser according to an embodiment of the present invention.

A substrate in the embodiments of the present invention may be an integral substrate, for example, a corresponding active gain region, optical branching region, reflective mode selection region, optical power tuning region, second phase shift region, and the like are coupled on one substrate, as shown in FIG. 5. The substrate in the embodiments of the present invention may also include two pieces of substrates: a first substrate and a second substrate respectively, as shown in FIG. 10. The substrate in the embodiments of the present invention may be a III-V compound substrate, or may be a silicon substrate.

A highly reflective surface, an active gain region, an optical branching region, and a reflective mode selection region that are in the embodiments of the present invention are necessary structures; an antireflective surface, a bent waveguide, an optical power tuning region, a second phase shift region, and a spot adjustment region are optional structures, and these optional structures may be used in any combination. In the present invention, the optical branching region may be a Y-type waveguide, or may be a 1×N multimode interferometer.

A laser provided by the embodiments of the present invention includes a substrate and a resonant cavity. In addition to an active gain region, a first phase shift region, an optical branching region, and N reflective mode selection regions, the resonant cavity further includes a highly reflective surface, where a reflectivity of the highly reflective surface is greater than reflectivities of the N reflective mode selection regions, so that laser beams are output from the N reflective mode selection regions. Because the laser naturally includes at least two reflective mode selection regions, at least two laser beams are output. According to the laser provided by the embodiments of the present invention, one laser can output two laser beams or even multiple laser beams; therefore, laser beam generation efficiency is high and average costs for generating a single laser beam are accordingly reduced.

In the present invention, a quantity of reflective mode selection regions of a laser may be greater than 2, and for a longitudinal mode selected from multiple reflective mode selection regions, a line width is narrower, and frequency uniformity is better.

In the embodiments of the present invention, reflectivities of reflective mode selection regions of a laser may be different, so as to implement unbalanced output of laser beams from multiple ports, thereby meeting different application scenarios.

A laser provided by the embodiments of the present invention may include an antireflective surface and a bent waveguide, which can effectively suppress end face reflection, enhance transmittance of an emitted laser beam, and improve laser beam emission efficiency.

A laser provided by the embodiments of the present invention may include at least one second phase shift region, configured to flexibly adjust a phase of light, so that phases of light of each reflective mode selection region are the same during light combination, and an overlapping effect is generated, thereby improving laser beam generation efficiency.

A substrate of a laser provided by the embodiments of the present invention may include a first substrate and a second substrate that are separated, where an active gain region and a first phase shift region are coupled on the first substrate, an optical branching region and N reflective mode selection regions are coupled on the second substrate, and the first phase shift region is optically coupled with the optical branching region by using a lens. The laser using two substrates features a significantly larger resonant cavity length than an ordinary laser, and therefore, more excellent narrow linewidth performance may be obtained.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A laser, comprising:
a substrate; and
a resonant cavity comprising a reflective surface, an active gain region, a first phase shift region, an optical branching region, and N reflective mode selection regions, wherein the resonant cavity is configured to generate a laser beam, and N is greater than or equal to 2;
the active gain region, the first phase shift region, the optical branching region, and the N reflective mode selection regions are coupled to the substrate;
the active gain region comprises two ports, and the two ports of the active gain region are optically coupled with the reflective surface and the first phase shift region respectively;
the first phase shift region comprises two ports, and the two ports of the first phase shift region are optically coupled with the active gain region and the optical branching region respectively;
the optical branching region comprises N+1 ports, one port of the optical branching region is optically coupled with the first phase shift region, and the other N ports of the optical branching region are optically coupled with the N reflective mode selection regions respectively;
each reflective mode selection region of the N reflective mode selection regions comprises two ports, one port is optically coupled with the optical branching region, and the other port is configured to output the laser beam;
a reflectivity of the reflective surface is greater than reflectivities of the N reflective mode selection regions; and
N antireflective surfaces, and the N antireflective surfaces are optically coupled respectively with the ports that are of the N reflective mode selection regions and that are configured to output the laser beam.

2. The laser according to claim 1, wherein
the active gain region comprises a III-V compound and is configured to generate spontaneous emission light under the effect of forward bias;
the first phase shift region is configured to tune a spectral position of a longitudinal mode of the resonant cavity by changing a refractive index of the first phase shift region;
the optical branching region is configured to perform power splitting on light from the first phase shift region and output N beams of light obtained after power splitting to the N reflective mode selection regions, and is further configured to combine light from the N reflective mode selection regions and output light obtained after light combination to the first phase shift region; and each of the N reflective mode selection regions comprise a transflective structure, whereby a reflection peak emerges periodically on a spectral reflectance curve of each reflective mode selection region as a light wavelength changes continually, and the spectral reflectance curves of the N reflective mode selection regions have reflection peaks at a same wavelength position, wherein the spectral reflectance curve is a spectral line that uses the light wavelength or a light frequency as a horizontal axis and a reflectivity as a vertical axis and that reflects variation of the reflectivity with the light wavelength.

3. The laser according to claim 2, wherein reflectivities in spectral reflectance curves of at least two reflective mode selection regions of the N reflective mode selection regions are mutually different at the wavelength position.

4. A laser, comprising:
a substrate; and
a resonant cavity comprising a reflective surface, an active gain region, a first phase shift region, an optical branching region, and N reflective mode selection regions, wherein the resonant cavity is configured to generate a laser beam, and N is greater than or equal to 2;
the active gain region, the first phase shift region, the optical branching region, and the N reflective mode selection regions are coupled to the substrate;
the active gain region comprises two ports, and the two ports of the active gain region are optically coupled with the reflective surface and the first phase shift region respectively;
the first phase shift region comprises two ports, and the two ports of the first phase shift region are optically coupled with the active gain region and the optical branching region respectively;
the optical branching region comprises N+1 ports, one port of the optical branching region is optically coupled with the first phase shift region, and the other N ports of the optical branching region are optically coupled with the N reflective mode selection regions respectively;
each reflective mode selection region of the N reflective mode selection regions comprises two ports, one port is optically coupled with the optical branching region, and the other port is configured to output the laser beam; and
a reflectivity of the reflective surface is greater than reflectivities of the N reflective mode selection regions, wherein
the laser further comprises N optical power tuning regions and N antireflective surfaces, wherein each optical power tuning region has two ports, one port is optically coupled with the port that is of one reflective mode selection region and that is configured to output the laser beam, the other port is optically coupled with one antireflective surface, and the optical power tuning region is configured to tune power of the laser beam emitted from the reflective mode selection region.

5. A laser, comprising:
a substrate; and
a resonant cavity comprising a reflective surface, an active gain region, a first phase shift region, an optical branching region, and N reflective mode selection regions, wherein the resonant cavity is configured to generate a laser beam, and N is greater than or equal to 2;
the active gain region, the first phase shift region, the optical branching region, and the N reflective mode selection regions are coupled to the substrate;
the active gain region comprises two ports, and the two ports of the active gain region are optically coupled with the reflective surface and the first phase shift region respectively;
the first phase shift region comprises two ports, and the two ports of the first phase shift region are optically coupled with the active gain region and the optical branching region respectively;
the optical branching region comprises N+1 ports, one port of the optical branching region is optically coupled with the first phase shift region, and the other N ports of the optical branching region are optically coupled with the N reflective mode selection regions respectively;
each reflective mode selection region of the N reflective mode selection regions comprises two ports, one port is optically coupled with the optical branching region, and the other port is configured to output the laser beam; and
a reflectivity of the reflective surface is greater than reflectivities of the N reflective mode selection regions, wherein
the laser further comprises N optical power tuning regions, N bent waveguide structures, and N antireflective surfaces, wherein each optical power tuning region and each bent waveguide structure have two ports, one port of each optical power tuning region is optically coupled with the port that is of one reflective mode selection region and that is configured to output the laser beam, the other port of each optical power tuning region is optically coupled with one bent waveguide structure, one port of each bent waveguide structure is optically coupled with one optical power tuning region, and the other port of each bent waveguide structure is optically coupled with one antireflective surface; and the optical power tuning region is configured to tune power of the laser beam emitted from the reflective mode selection region.

6. A laser, comprising:
a substrate; and
a resonant cavity comprising a reflective surface, an active gain region, a first phase shift region, an optical branching region, and N reflective mode selection regions, wherein the resonant cavity is configured to generate a laser beam, and N is greater than or equal to 2;
the active gain region, the first phase shift region, the optical branching region, and the N reflective mode selection regions are coupled to the substrate;
the active gain region comprises two ports, and the two ports of the active gain region are optically coupled with the reflective surface and the first phase shift region respectively;
the first phase shift region comprises two ports, and the two ports of the first phase shift region are optically coupled with the active gain region and the optical branching region respectively;
the optical branching region comprises N+1 ports, one port of the optical branching region is optically coupled with the first phase shift region, and the other N ports of the optical branching region are optically coupled with the N reflective mode selection regions respectively;
each reflective mode selection region of the N reflective mode selection regions comprises two ports, one port is optically coupled with the optical branching region, and the other port is configured to output the laser beam; and a reflectivity of the reflective surface is greater than reflectivities of the N reflective mode selection regions, wherein the laser further comprises at least one second phase shift region;

the at least one second phase shift region is coupled to the substrate;

at least one reflective mode selection region of the N reflective mode selection regions is optically coupled with the optical branching region by using the at least one second phase shift region; and the at least one second phase shift region is configured to adjust a phase of light passing through the at least one second phase shift region.

7. A laser, comprising:

a substrate; and a resonant cavity comprising a reflective surface, an active gain region, a first phase shift region, an optical branching region, and N reflective mode selection regions, wherein the resonant cavity is configured to generate a laser beam, and N is greater than or equal to 2;

the active gain region, the first phase shift region, the optical branching region, and the N reflective mode selection regions are coupled to the substrate;

the active gain region comprises two ports, and the two ports of the active gain region are optically coupled with the reflective surface and the first phase shift region respectively;

the first phase shift region comprises two ports, and the two ports of the first phase shift region are optically coupled with the active gain region and the optical branching region respectively;

the optical branching region comprises N+1 ports, one port of the optical branching region is optically coupled with the first phase shift region, and the other N ports of the optical branching region are optically coupled with the N reflective mode selection regions respectively;

each reflective mode selection region of the N reflective mode selection regions comprises two ports, one port is optically coupled with the optical branching region, and the other port is configured to output the laser beam; and a reflectivity of the reflective surface is greater than reflectivities of the N reflective mode selection regions, wherein the laser further comprises a spot adjustment region;

the first phase shift region is optically coupled with the optical branching region by using the spot adjustment region; and the spot adjustment region is configured to adjust a spot in light passing through the spot adjustment region.

8. The laser according to claim 7, wherein the substrate comprises a first substrate and a second substrate that are separated, and an empty slot is disposed between the first substrate and the second substrate;

the active gain region and the first phase shift region are coupled on the first substrate, and the optical branching region and the N reflective mode selection regions are coupled on the second substrate; and the spot adjustment region is a lens and disposed in the empty slot.

9. The laser according to claim 1, wherein
the reflectivity of the reflective surface is greater than 50%.

10. The laser according to claim 1, wherein
the reflective mode selection region is a sampled fiber Bragg grating structure, or a superstructured sampled grating distributed Bragg reflector, or a microring structure.

11. The laser according to claim 1, wherein
if N is equal to 2, the optical branching region is a Y-type waveguide or a 1×2 multimode interferometer; and
if N is greater than 2, the optical branching region is a 1×N multimode interferometer.

\* \* \* \* \*